(12) United States Patent
Miyakawa et al.

(10) Patent No.: US 7,192,150 B2
(45) Date of Patent: Mar. 20, 2007

(54) WORK PIECE HOLDING APPARATUS, WORK PIECE ILLUMINATION APPARATUS AND WORK PIECE INSPECTION SYSTEM

(75) Inventors: Yoshihiko Miyakawa, Tokyo (JP); Hidetoshi Suzuki, Tokyo (JP); Hiroshi Wakabayashi, Tokyo (JP); Hitoshi Nakayama, Tokyo (JP); Akimasa Nakao, Tokyo (JP)

(73) Assignee: TDK Corporation, Tokyo (JP)

( * ) Notice: Subject to any disclaimer, the term of this patent is extended or adjusted under 35 U.S.C. 154(b) by 243 days.

(21) Appl. No.: 10/834,346

(22) Filed: Apr. 29, 2004

(65) Prior Publication Data

US 2004/0240197 A1 Dec. 2, 2004

(30) Foreign Application Priority Data

May 28, 2003 (JP) ............................. 2003-150361

(51) Int. Cl.
*F21V 13/00* (2006.01)
(52) U.S. Cl. ............................. 362/33; 362/89; 29/721
(58) Field of Classification Search .................. 29/721; 362/33, 89
See application file for complete search history.

(56) References Cited

U.S. PATENT DOCUMENTS 5,420,691 A * 5/1995 Kawaguchi ................. 29/721

5,864,944 A 2/1999 Kashiwagi et al.

FOREIGN PATENT DOCUMENTS

| JP | 62-60292 | 3/1967 |
|----|----------|--------|
| JP | 2-19436 | 2/1990 |
| JP | 2-243232 | 9/1990 |
| JP | 3-224096 | 10/1991 |
| JP | 6-120699 | 4/1994 |
| JP | 2000-357895 | 12/2000 |
| JP | 2002-288812 | 10/2002 |

* cited by examiner

*Primary Examiner*—Stephen F Husar
(74) *Attorney, Agent, or Firm*—Oblon, Spivak, McClelland, Maier & Neustadt, P.C.

(57) ABSTRACT

The present invention relates to an electronic part holding apparatus used for an FPC bonding apparatus or the like. An object of the present invention is to provide the structure including an illumination apparatus used for image detection that can illuminate a predetermined area stably and uniformly. To attain that object, in the holding apparatus having functions of holding and illuminating a work piece, the holding position and the illumination position are made different, and the deformation of the work piece is made possible at the illumination position.

6 Claims, 4 Drawing Sheets

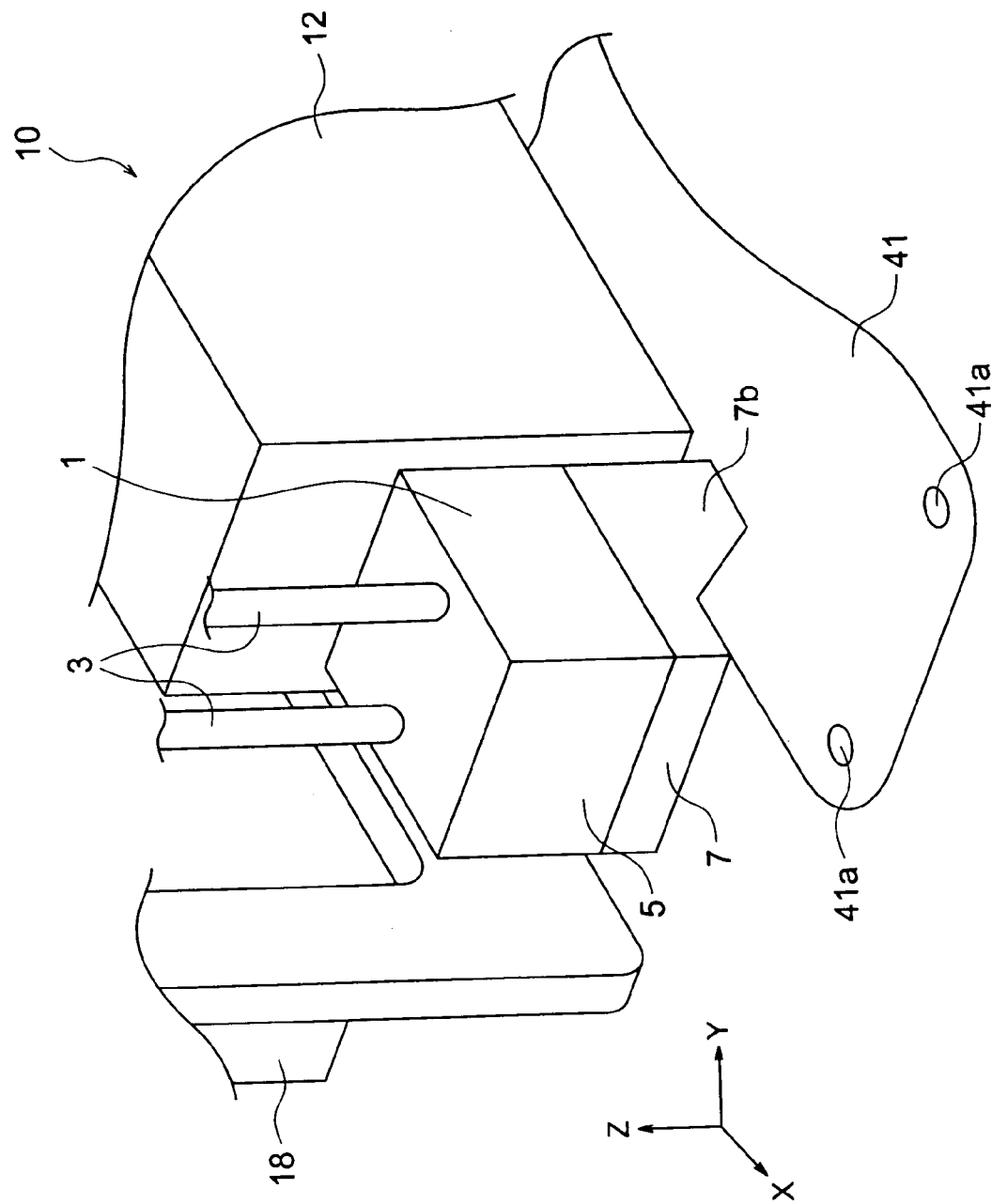

WORK PIECE HOLDING APPARATUS, WORK PIECE ILLUMINATION APPARATUS AND WORK PIECE INSPECTION SYSTEM

BACKGROUND OF THE INVENTION

1. Field of the Invention

The present invention relates to a holding apparatus for holding a work piece such as a chip part or an IC or the like by so-called vacuum suction or the like and conveying the work piece onto another member to attach the work piece to that member. More particularly, the present invention relates to an illumination method for illuminating a work piece held by a holding member with light to allow detection of a condition of the work piece such as the held position thereof based on an image of the work piece thus illuminated, or relates to a holding apparatus equipped with an illumination apparatus for carrying out that illumination method. The present invention also relates to an inspection system for inspecting the holding state of a work piece when the work piece is held by the aforementioned holding apparatus.

2. Related Background Art

Generally, a chip part such as a resistor or a condenser is picked up from a storing station by a so-called automatic mounting apparatus and mounted on a circuit board. The automatic mounting apparatus is equipped with a holding apparatus for holding a chip part, with which a chip part is actually held and conveyed to the mounting site. In some cases, the chip mounting operation is also carried out by this holding apparatus. Holding of a chip part by this holding apparatus is achieved by, for example, so called vacuum suction. When a chip part is held, positional displacement can occur, in other words, the held position or holding state of the chip part can vary for every individual chip part. In view of this, it is a general practice to pick up an image of the chip part holding state by a camera or the like and change the driving trajectory of the holding apparatus or the position of the circuit board to which the chip part is to be mounted based on the picked up image so as to cope with the positional displacement.

The above-described automatic mounting apparatus is provided with an illumination apparatus for illuminating a chip part used for the aforementioned image pickup operation. An image of the chip part is obtained by illuminating the chip part from the holding apparatus side by means of that illumination apparatus. The image is picked up by a camera that is disposed at a position opposed to the holding apparatus with the chip part between, and the aforementioned image processing is carried out. The illumination apparatuses are roughly categorized into transmissive type and reflective type in accordance with their scheme.

Specific examples of the transmissive type illumination apparatus are disclosed in Japanese Patent Application Laid-Open No. 62-060292 or Japanese Patent Application Laid-Open No. 02-243232. Typically, the holding apparatus is composed of a body portion and a suction nozzle for actually vacuum-sucking a chip part. In these transmissive type illumination apparatuses, a plate-like structure for diffusing and transmitting light is arranged between the suction nozzle and the body portion, and light is projected to the apparatus body side surface of that structure. Thus, the light is guided to a chip part through that structure so that an image of the chip part is formed. In the case of the reflective type illumination apparatus, a chip part or the like is actually illuminated by light and the shape or other properties of the chip part is detected based on the reflected light. However, since the condition of the image of the chip part thus obtained varies depending on the reflectance or other properties of the chip part, it is difficult to realize uniform illumination conditions. In addition, since it is necessary to dispose the illumination apparatus in the periphery of the holding apparatus, there is the problem that the size of the apparatus as a whole becomes large.

In recent years, downsizing of parts has been achieved, and the current situation is that the outer diameter of the suction end of a suction nozzle is larger than the external size of a chip part. As a result, the above-described holding apparatus picks up an image of the external shape of the nozzle end portion simultaneously with the chip part. Therefore, an apparatus that can pick up an image of the external shape of even an extremely small chip part is demanded. To meet the demand, illumination apparatus disclosed in Japanese Patent Application Laid-Open No. 06-120699 has been proposed. This illumination apparatus is composed of a substantially ring-shaped semitransparent structure called a nozzle cap that contains a light emitting member such as a light emitting diode arranged in the outer circumferential portion. By arranging the illumination apparatus having the above-described structure in the vicinity of the end portion of the suction nozzle, image pickup processing can be performed for a chip part of a smaller size.

One exemplary application of the above-described holding apparatus is to bond a flexible printed circuit board (FPC) having flexibility to a head supporting member used in a flying type magnetic disk apparatus. Such a bonding process has been put into practice in view of demands for downsizing of magnetic heads, necessity for maintaining weight balance of magnetic head with high accuracy, demands for downsizing, and demands for an increase in density. Demands for that process are expected to increase further. In that process, a flexible printed circuit board placed on a waiting site is sucked to be held by a holding apparatus, and transferred onto a head supporting member that is fixedly held at a predetermined position. During the transfer process, the holding state of the flexible printed circuit board and the head supporting member is detected utilizing image processing. An adhesive has been applied at a predetermined portion of the head supporting member in advance, and the flexible printed circuit board is pressed against the adhesive with a predetermined positional relationship being maintained, so that the flexible printed circuit board and the head supporting member are securely adhered together.

A bonding method used for the aforementioned process in Japanese Patent Application Laid-open No. 2002-288812 has also been proposed. It is necessary for the holding apparatus used in that process to be provided with a member for pressing a predetermined portion of a flexible printed circuit board against adhesive in addition to the aforementioned suction nozzle. In addition, since the flexible printed circuit board is a member having a considerable length, a plurality of suction nozzles might be required as holding apparatuses in some cases. In that case, or in the case that for example the illumination apparatus disclosed in the aforementioned Japanese Patent Application Laid-Open No. 06-120699 is used, it is necessary to illuminate a specific portion on the flexible printed circuit board for which displacement amount or other factors is to be measured more efficiently in order to obtain a more clear image. However, it is considered that it would be difficult in some cases to arrange such an illumination apparatus at a position corresponding to the specific portion due to constraint of the structure.

On the other hand, a member having a pressing function is sometimes provided in addition to the suction nozzle. The illumination apparatuses disclosed in the aforementioned Japanese Patent Application Laid-Open No. 06-120699, Japanese Patent Application Laid-Open No. 62-060292, Japanese Patent Application Laid-Open No. 02-243232 or Japanese Utility Model Application Laid-Open No. 02-019436 might suffer from the problem that there might be hardly space for mounting such a member to spare. In other words, in the case that the holding apparatus is equipped with a plurality of suction nozzles for handling a single part such as a chip part, if the apparatus has a member for applying some effects (for example, a member for applying a load to the held part together with the suction nozzles), preferable effects may not be realized with use of conventional illumination apparatuses as they are.

SUMMARY OF THE INVENTION

The present invention has been made in view of the above-described situation. An object of the present invention is to provide an FPC (flexible printed circuit board) holding apparatus or an illumination apparatus for such a holding apparatus with which the holding state of a flexible printed circuit board can be favorably detected and boding of the flexile printed circuit board can be successfully carried out in a magnetic head manufacturing process for bonding a flexible printed circuit board to a head supporting member. In addition, another object of the present invention is to provide a holding apparatus provided, in addition to a single suction nozzle, with a member for applying an additional effect on a part sucked by the nozzle and equipped with an illumination apparatus that can illuminate the part sucked by the suction nozzle in a more preferable manner. These illumination apparatuses are illumination apparatuses used for image detection, that can illuminate a predetermined area stably and uniformly. A still other object of the present invention is to provide an illumination apparatus, an inspection system and a work piece fixing apparatus using those illumination apparatus and inspection system used for preferable inspection of the holding state of a flexible printed circuit board or the like held by the above-described holding apparatus.

According to the present invention that is intended to solve the aforementioned problems, there is provided a work piece holding apparatus that holds a work piece, transfers the work piece to a predetermined position and moves or deforms a predetermined portion of the work piece toward a specific direction, comprising a body portion having a work piece sucking mechanism for holding the work piece, and a pressing member that is disposed at a position different from the work piece sucking mechanism and movable relative to the body portion, for moving or deforming the predetermined portion of the work piece toward the specific direction by its own movement, wherein the pressing member includes a light transmissive member disposed at a position corresponding to the predetermined portion of the work piece.

In the above-described work piece holding apparatus, it is preferable that light be guided to a surface of the light transmissive member that is different from a surface close to the work piece via an optical cable, and an optical axis of light radiated from the optical cable coincide with the direction of movement of the pressing member.

The above-described work piece holding apparatus is preferably applied to a work piece fixing apparatus. Such a work piece fixing apparatus preferably comprises the above-described holding apparatus, a camera opposed to the pressing member with the work piece between, a table for supporting the work piece, and a table for supporting a fixation target to which the work piece is to be fixed, wherein the holding apparatus is provided with a position adjusting mechanism for adjusting holding state of the work piece in accordance with image information of the work piece obtained by the camera.

A work piece illumination apparatus according to the present invention that is intended to solve the aforementioned problems is an illumination apparatus used with a work piece holding body portion that holds and transfers a work piece, comprising a cable holding member that fixedly holds an optical cable for guiding light to the illumination apparatus in such a way that the optical cable is oriented in a predetermined direction, and a pressing illumination member fixed to the cable holding member with a predetermined spacing from an end portion of the optical cable, the pressing illumination member including light transmissive portion that receives light radiated from the end portion of the optical cable at its rear surface and transmits it to its front surface, wherein the pressing illumination member can be driven independently from the work piece holding body portion, and when driven as above, the pressing illumination member applies a load to the work piece by a surface of the light transmissive portion to move or deform the work piece toward a predetermined direction.

A work piece illumination apparatus according to the present invention intended to solve the aforementioned problems is an illumination apparatus for illuminating a work piece while holding and transferring the work piece, comprising a cable holding member that fixedly holds an optical cable for guiding light to the illumination apparatus in such a way that the optical cable is oriented in a predetermined direction, and a pressing illumination member fixed to the cable holding member with a predetermined spacing from an end portion of the optical cable, the pressing illumination member including a light transmissive portion that receives light radiated from the end portion of the optical cable at its rear surface and transmitting it to its front surface, wherein the pressing illumination member holds the work piece by the surface of the light transmissive portion and applies a load to the work piece in a specific direction by a surface of the light transmissive portion to move or deform the work piece, and an optical axis of light radiated from the optical cable end portion coincides with the specific direction.

The above-described work piece illumination apparatus is preferably applied to a work piece fixing apparatus. Such a work fixing apparatus preferably comprises the above-described illumination apparatus, a camera opposed to the illumination apparatus with the work piece between, a table for supporting the work piece, and a table for supporting a fixation target to which the work piece is to be fixed, wherein the illumination apparatus is provided with a position adjusting mechanism for adjusting holding state of the work piece in accordance with image information of the work piece obtained by the camera.

A work piece inspection system according to the present invention intended to solve the aforementioned problems is an inspection system for, when a work piece is held by a holding apparatus, inspecting a holding state of the work piece, comprising a holding apparatus including a holding body portion for holding the work piece at its holding position and an illumination apparatus for illuminating a predetermined position on the work piece that is different from the holding position, and a camera opposed to the illumination apparatus with the predetermined position on the work piece between.

In the above-described inspection system, it is preferable that the illumination apparatus include an optical cable for providing a light source and a light transmissive member disposed at a position corresponding to the predetermined position on the work piece, and the work piece be illuminated with light guided by the optical cable via the light transmissive member. In addition, it is preferable that the illumination apparatus illuminate the work piece while functioning as an area light source utilizing a light diffusing member.

The above-described work piece inspection system is preferably applied to a work piece fixing apparatus. Such a work piece fixing apparatus preferably comprises the above-described inspection system, a table for supporting the work piece, and a table for supporting a fixation target to which the work piece is to be fixed, wherein the holding apparatus is provided with a position adjusting mechanism for adjusting holding state of the work piece in accordance with image information of the work piece obtained by the camera.

BRIEF DESCRIPTION OF THE DRAWINGS

FIG. 6 is an enlarged view showing a principal part of the boding apparatus shown in FIG. 5.

DESCRIPTION OF THE PREFERRED EMBODIMENTS

Figure 1:
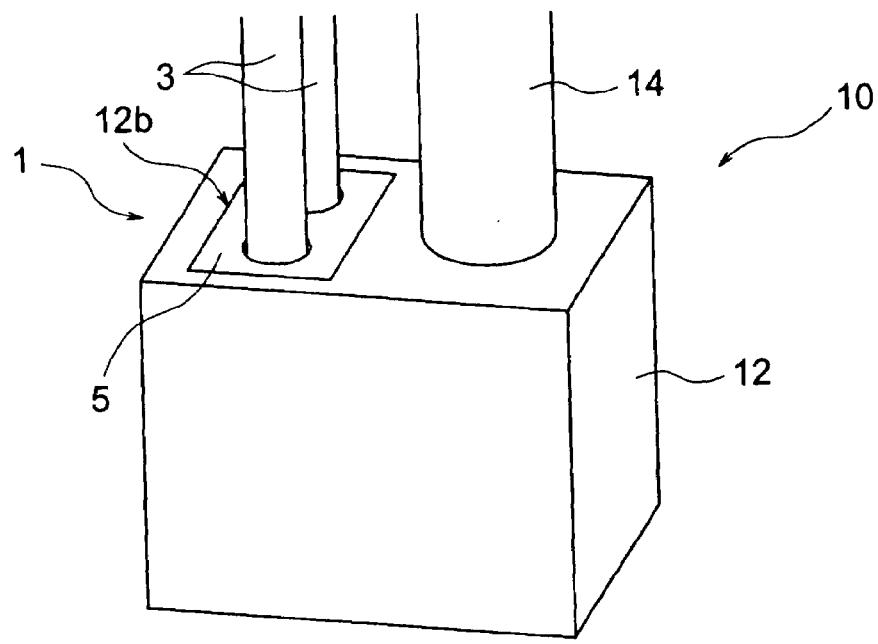
FIG. 1 is a perspective view showing an external appearance of a holding apparatus as an embodiment of the present invention.
Figure 2:
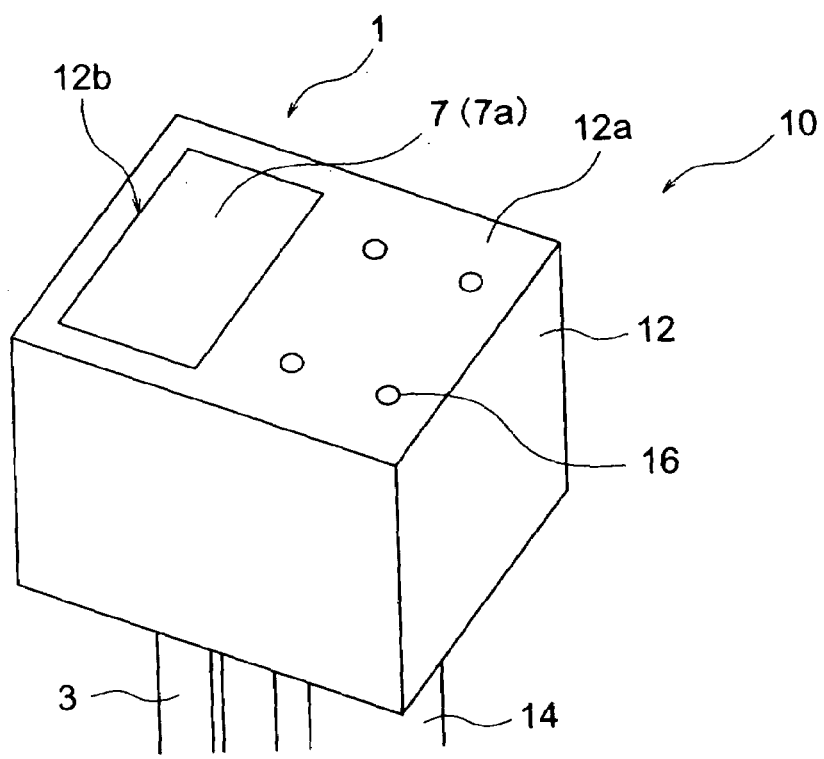
FIG. 2 is a perspective view showing the holding apparatus shown in FIG. 1 as seen from its back side.

In the following, an embodiment of the holding apparatus according to the present invention will be described with reference to the accompanying drawings. FIG. 1 is a perspective view showing the holding apparatus according to the present invention as seen from an oblique direction. FIG. 2 is a perspective view showing an illumination member as seen from the underside. The holding apparatus 10 is composed of a body portion 12 and an illumination member or an illumination device 1. The body portion 12 is provided with nozzle openings 16 formed on the backside 12a for achieving a function of a suction jig. The nozzle openings 16 are connected to a suction pipe 14 via air suction paths provided in the interior of the body portion 12. A work piece such as a flexile printed circuit board (FPC) is sucked to be held by the holding apparatus by means of the nozzle openings 16. In the interior of the body portion 12, there is provided a through bore 12b, in which an illumination member 1 is fitted.

Figure 3:
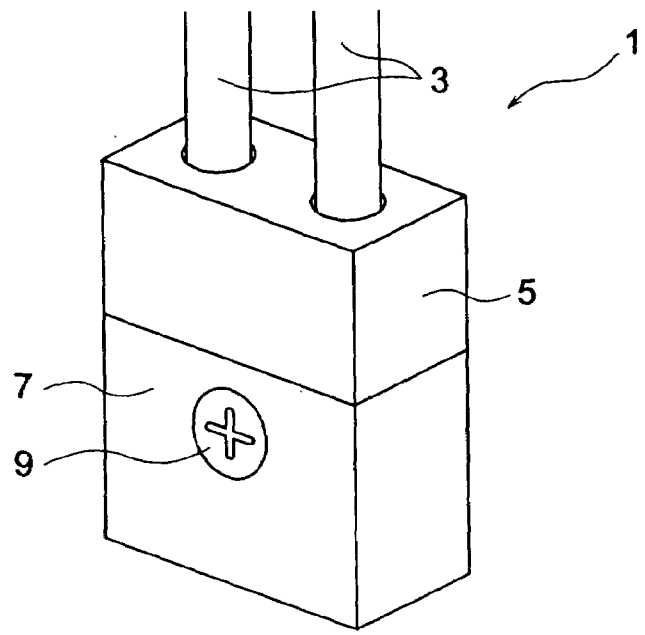
FIG. 3 is a perspective view showing an external appearance of an illumination member used in the holding apparatus shown in FIG. 1.
Figure 4:
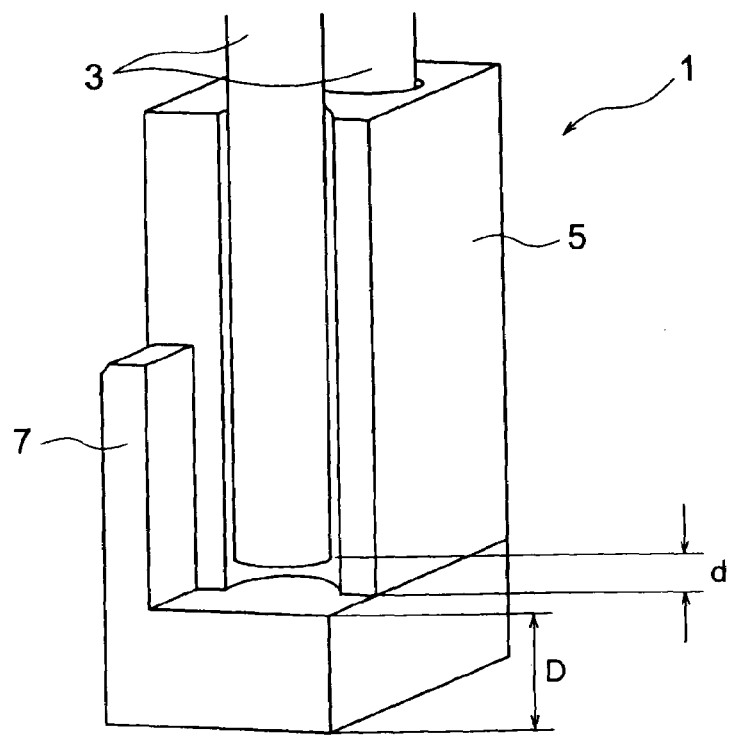
FIG. 4 partly shows the internal structure of the illumination member shown in FIG. 3.

FIG. 3 is a perspective view showing the illumination member 1 of the illumination apparatus shown in FIGS. 1 and 2 as seen from an oblique direction. FIG. 4 shows the illumination member 1 shown in FIG. 3 as seen from a direction different from in FIG. 3. In FIG. 4, the internal structure of the illumination member is partly shown. The illumination member 1 is composed of an optical cable 3 for guiding illumination light to the illumination member 1, a cable holding member 5 for holding the optical cable 3 and a pressing illumination member 7 fixed to the cable holding member 5 by a screw 9.

The pressing illumination member 7 is made of a light transmissive plastic such as a PMMA, AS, ABS or PC or a glass. The pressing illumination member 7 has been subjected to diffusion processing so that it can diffuse light from a point light source provided by the optical cable 3. In the case that the material of the pressing illumination member 7 is a plastic, the diffusion processing can be realized by mixing a diffusing material in that material. When a diffusion processing is applied to a pressing illumination member that is manufactured by molding, the diffusion processing may be realized by a process of roughing the surface of the mold and transferring it to the front side of the molded piece. Alternatively, a surface of the pressing illumination member may be made rough by a chemical or a blasting process. By imparting light diffusing properties to the light transmission surface of the pressing illumination member, the light source that actually illuminates the flexible printed circuit board can be made into substantially an area light source. Consequently, a clearer image can be obtained when an image of the flexible printed circuit board is picked up by a camera.

The optical cable 3 is held by the cable holding member 5 in such a way that the optical axis of light radiation is oriented in a predetermined direction opposed to the image pickup direction of the camera used for image processing. There are two optical cables 3 used as light sources in this embodiment, which are respectively held by the cable holding member 5 relative to the pressing illumination member 7 with a spacing d. The pressing illumination member 7 has a thickness D along the direction of the aforementioned optical axis. The values of the spacing d and the thickness D are appropriately determined in accordance with the light transmissivity and diffusing performance of the pressing illumination member 7 and the intensity of the light guided by the optical cable 3.

In the above described illumination apparatus according to the present invention, the illumination member 1 is adapted to be movable relative to the body portion 12 in the direction of the optical axis of the light radiated from the end of the optical cable 3. In the actual FPC bonding process, the flexible printed circuit board is sucked by nozzle openings 16, and then the flexible printed circuit board is pressed against the head supporting member by the illumination member 1 (i.e. the flexible printed circuit board is bonded to an adhesive applied on the head supporting member). In other words, the illumination member 1 functions as a pressing member for applying a load to the flexible printed circuit board. Specifically, a predetermined portion of the flexible printed circuit board is deformed or moved toward a predetermined position on the head supporting member by the illumination member 1.

As per the above, with the above-described illumination apparatus, it is possible to suck and hold a flexible printed circuit board in such a way that the portion whose holding state is required to be detected most accurately (that is, in the case of the flexible circuit board, the portion that is to be bonded to the head supporting member) is set at a position corresponding to the illumination apparatus 1. Therefore, the bonding process can be carried out with high precision by illuminating the flexible printed circuit board in the aforementioned state by the illumination member 1, picking up an image by a camera and processing the obtained image.

In short, in the structure adopted by the present invention, the holding position and the illumination position of a work piece in the form of a flexible printed circuit board are different and the illumination position substantially coincides with the predetermined bonding position on the head supporting member serving as the fixation target. Therefore, according to the present invention, illumination, image pickup and detection of holding position of the portion on a flexible printed circuit board that is actually bonded to a head supporting member are carried out, so that that portion will be bonded to a predetermined position on the head supporting member precisely. In addition, according to the present invention, the bonding operation can be performed while a large area of the bonding portion of the flexible printed circuit board is pressed by the bottom end surface 7a of the pressing illumination member 7. Consequently, a partial load is not applied to the flexible printed circuit board in the bonding portion, and it is possible to reduce the possibility of excessive deformation of the flexible printed circuit board or breakage of the wiring formed on the flexible printed circuit board.

Although the illumination member and the body portion are constructed as different parts in this embodiment, the present invention is not limited to this particular feature, but they may be constructed as a single integral part. In addition, the number and position of the nozzle openings and the number and position of the illumination members relative to the body portion are not limited to those of the above-described embodiment. It is preferable that these features be modified appropriately in accordance with an object to be held by suction by the apparatus. Furthermore, although the bottom surfaces of the body portion and the pressing illumination member are flat in this embodiment, it is preferable that the shape of those surfaces be modified appropriately in accordance with the shape or other factors of an object to be held by suction.

Figure 5:
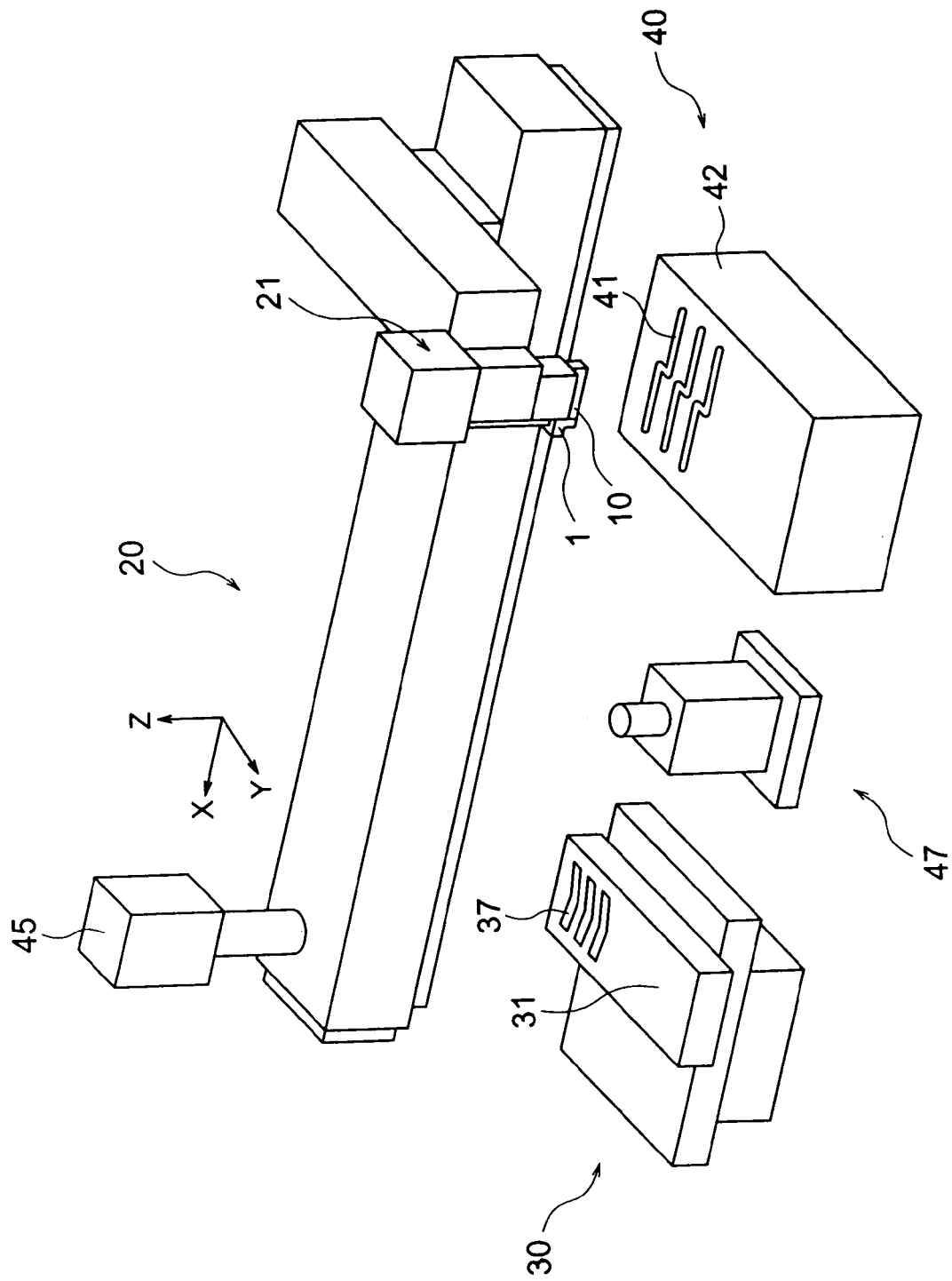
FIG. 5 shows the basic structure of an apparatus for bonding a flexible printed circuit board to a head supporting member in which a holding apparatus according to the present invention is used.

Next, an FPC (flexible printed circuit board) bonding apparatus that utilizes the holding apparatus according to the present invention will be described in the following. FIG. 5 schematically shows the basic structure of the FPC bonding apparatus. This apparatus is composed of an FPC bonding portion 20, a head supporting portion supply table portion 30, a camera 45 for the load beam disposed above the head supporting member supply table portion 30 for detecting the position of a head support member placed on the table portion 30, an FPC supply table portion 40 and a camera 47 for the flexible printed circuit board for picking up an image of the holding state of the flexible printed circuit board under transfer.

The FPC bonding portion 20 includes a head portion 21 that supports the holding apparatus 10 according to the present invention. The head portion 21 is adapted to be movable in the three directions along the X, Y and Z axes and rotatable on the X-Y plane (θ-rotation). In addition, an optical cable and a suction pipe are connected to the holding apparatus 10, though illustration thereof are omitted in FIG. 5 in order to facilitate understanding of the structure of the apparatus.

In the holding apparatus 10 in this embodiment, an illumination member 1 is disposed on the side of a body portion 12, contrary to the above-described embodiment. FIG. 6 schematically shows the basic structure of the holding apparatus under the state just before holding a flexible printed circuit board by suction as seen from the oblique front side. The illumination member 1 is disposed in such a way as to be juxtaposed with the body portion 12 in the direction in which the flexible printed circuit board 41 extends (i.e. the X direction). The illumination member 1 is driven relative to the body portion 12 in the Z direction by means of a well-known driving mechanism that is not shown in the drawings. On a pressing illumination member 7 of the illumination member 1, there is formed a projecting portion 7b, by which the flexible printed circuit board 41 is pressed against an adhesive on the head supporting member. On the flexible printed circuit board 41, there are provided holes 41a used for position detection. The position of the holes 41a are made clear by illumination light supplied via the illumination member 1 so that a clear image can be obtained by an image pickup process that will be performed later.

The head supporting member supply table portion 30 includes a head supporting member supply table 31 on the top surface of which the head supporting member 37 is placed. The head supporting member supply table 31 is provided with a mechanism for driving it as a well-known X-Y table and the table 31 is movable in the direction of the respective axes. The FPC supply table portion 40 includes an FPC supply table 42 on the top surface of which the flexible printed circuit board 41 is placed. The FPC supply table 42 is movable in the Y direction indicated in FIG. 6. The driving mechanism used for driving the aforementioned tables may be constructed by a ball screw and a stepping motor etc. that are generally used. Various structures for these mechanisms may be adopted in accordance with required accuracy in the stopped position, driving speed or other factors. Such a structure itself is not directly relevant to the present invention, and the description thereof will be omitted.

Next, an actual FPC bonding process will be briefly described. Firstly, the head portion 21 is moved to a position directly above one of a plurality of flexible printed circuit boards 41 arranged side by side on the FPC supply table 42. Subsequently, the head portion 21 is lowered toward the target flexible printed circuit board 41 and the flexible printed circuit board 41 is sucked by the holding apparatus 10. After the flexible printed circuit board 41 is sucked, the head portion 21 is elevated up to the original height and then moved in the X direction so as to be positioned directly above the head supporting member supply table 31. During this movement, illumination of the flexile printed circuit board 41, image pickup of the flexible printed circuit board 41 by the camera 47 for the flexible printed circuit board and a process for detecting the holding state of the flexible printed circuit board 41 by image processing are performed. Specifically, the camera 47 picks up an image of the aforementioned holes 41a on the flexible printed circuit board 41.

At the same time, the camera 45 for the load beam detects a position of a head supporting member 37 to which the flexible printed circuit board 41 is to be adhered by this operation among the plurality of head supporting members 37 laid on the head supporting member supply table 31 in parallel to each other. After the position detection, the adhesive is applied onto a predetermined position on the head supporting member by the adhesive applying device not shown on the basis of thus obtained detection result. In addition, a position or the like at which the head portion 21 is stopped above the head supporting member on the basis of data relating to thus obtained position information and the condition of holding the flexible printed circuit board.

After the head portion 21 is stopped at the predetermined position as above, the head portion 21 is lowered and stopped at a position in which the head supporting member 37 and the flexible printed circuit board 41 are spaced apart from each other by a predetermined spacing. After the head portion 21 is thus stopped, the illumination member 1 is lowered, so that the flexible printed circuit board 41 is pressed against and bonded to the adhesive applied on the head supporting member 37 by the flat bottom end 7a of the pressing illumination member 7. At substantially the same time, the suction of the flexible printed circuit board 41 by the holding apparatus 10 is released. After the above-described operation, the illumination member 1 is returned to the original position relative to the holding apparatus 10 and the head portion 21 is moved to the position above the FPC supply table 42 again. Subsequently, the above described processes are repeated.

As per the above, with the use of the holding apparatus according to the present invention in an FPC bonding apparatus, it is possible to obtain position information on the bonding portion (i.e. the predetermined portion on a flexible printed circuit board that corresponds to the portion of a head supporting member on which adhesive is applied) at which positioning is of the most importance. In addition, since the flexible printed circuit board is pressed against the portion in which adhesive is applied by the flat surface 7a, the flexible printed circuit board and the adhesive are brought into contact with each other over a large area. Therefore, a stable adhesion strength can be obtained. Furthermore, with the pressing of the flexible printed circuit board to the portion on which adhesive is applied by the flat surface 7a, concentration of the load applied to the flexible printed circuit board upon pressing does not occur. Therefore, application of a force that can adversely affect the flexible printed circuit board can be reduced.

Although illumination member 1 and the body portion 12 are constructed as different parts in this embodiment, the present invention is not limited to this particular feature, but they may be constructed as a single integral part.

The present embodiment has been described with reference to the case in which the holding apparatus according to the present invention is applied to the FPC bonding apparatus. However, the application of the present invention is not limited to this embodiment, but it may be applied to various apparatuses that are adapted to hold an article and illuminate the article with light to detect the holding state based on information obtained from an image of the article so as to perform an additional processing.

With implementation of the present invention, in a manufacturing process of a magnetic head in which a flexible printed circuit board is bonded to a head supporting member, it is possible to detect the holding state of the flexible printed circuit board clearly and to perform a flexible printed circuit board bonding operation in a preferable way. Furthermore, according to the present invention, in the case that a holding apparatus is equipped, in addition to a single suction nozzle, with a member for performing an additional processing on an article sucked by the suction nozzle, it is possible to illuminate the sucked article in a preferable way and perform the aforementioned processing in a preferable manner. Still further, according to the present invention, it is possible to provide an illumination apparatus used for image detection that is compact in size and that can illuminate a predetermined area stably and uniformly.

What is claimed is:

1. A work piece holding apparatus that holds a work piece, transfers said work piece to a predetermined position and moves or deforms a predetermined portion of said work piece toward a specific direction, comprising:

a body portion having a work piece sucking mechanism for holding the work piece; and a pressing member that is disposed at a position different from said work piece sucking mechanism and movable relative to said body portion, for moving or deforming the predetermined portion of the work piece toward the specific direction by its own movement, wherein said pressing member includes a light transmissive member disposed at a position corresponding to the predetermined portion of said work piece, and wherein said body portion and said pressing member are movable as a unit, and are located at specific positions in the unit.

2. An apparatus according to claim 1, wherein light is guided to a surface of said light transmissive member that is different from a surface close to said work piece via an optical cable, and an optical axis of light radiated from said optical cable coincides with the direction of movement of said pressing member.

3. A work piece fixing apparatus comprising:

a holding apparatus according to claim 1 or 2;

a camera opposed to said pressing member with said work piece between;

a table for supporting said work piece; and a table for supporting a fixation target to which said work piece is to be fixed, wherein said holding apparatus is provided with a position adjusting mechanism for adjusting holding state of said work piece in accordance with image information of said work piece obtained by said camera.

4. An illumination apparatus used with a work piece holding body portion that holds and transfers a work piece, comprising:

a cable holding member that fixedly holds an optical cable for guiding light to said illumination apparatus in such a way that the optical cable is oriented in a predetermined direction; and a pressing illumination member fixed to said cable holding member with a predetermined spacing from an end portion of said optical cable, said pressing illumination member including light transmissive portion that receives light radiated from the end portion of said optical cable at its rear surface and transmits it to its front surface, wherein said pressing illumination member can be driven independently from said work piece holding body portion, and when driven as above, said pressing illumination member applies a load to said work piece by a surface of said light transmissive portion to move or deform the work piece toward a predetermined direction, and wherein said work piece holding body portion and said pressing illumination member are movable as a unit, and are located at specific positions in the unit.

5. An illumination apparatus for illuminating a work piece while holding and transferring said work piece, comprising:

a cable holding member that fixedly holds an optical cable for guiding light to said illumination apparatus in such a way that the optical cable is oriented in a predetermined direction; and a pressing illumination member fixed to said cable holding member with a predetermined spacing from an end portion of said optical cable, said pressing illumination member including a light transmissive portion that receives light radiated from the end portion of said optical cable at its rear surface and transmitting it to its front surface, wherein said pressing illumination member holds said work piece by the surface of said light transmissive portion and applies a load to said work piece in a specific direction by a surface of said light transmissive portion to move or deform the work piece, and an optical axis of light radiated from said optical cable end portion coincides with said specific direction.

6. A work fixing apparatus comprising:

an illumination apparatus according to claim 4 or 5;

a camera opposed to said illumination apparatus with said work piece between;

a table for supporting said work piece; and a table for supporting a fixation target to which said work piece is to be fixed, wherein said illumination apparatus is provided with a position adjusting mechanism for adjusting holding state of said work piece in accordance with image information of said work piece obtained by said camera.

* * * * *